United States Patent
Ho et al.

(10) Patent No.: US 6,417,046 B1
(45) Date of Patent: Jul. 9, 2002

(54) MODIFIED NITRIDE SPACER FOR SOLVING CHARGE RETENTION ISSUE IN FLOATING GATE MEMORY CELL

(75) Inventors: Ming-Chou Ho, Hsin-Chu; Wen-Ting Chu, Kaohsiung; Chang Song Lin; Chuan-Li Chang, both of Hsin-Chu; Hsin-Ming Chen, Tainan; Di-Son Kuo, Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/563,834

(22) Filed: May 5, 2000

(51) Int. Cl.[7] .............................................. H01L 21/336
(52) U.S. Cl. ....................... 438/257; 438/265; 438/303; 438/305
(58) Field of Search ................................ 438/257, 265, 438/303, 305, 306, 307

(56) References Cited

U.S. PATENT DOCUMENTS

| | | | |
|---|---|---|---|
| 4,982,250 A | * | 1/1991 | Manos, II et al. |
| 5,286,665 A | * | 2/1994 | Muragishi et al. |
| 5,460,992 A | | 10/1995 | Hasegawa ..................... 437/43 |
| 5,573,965 A | | 11/1996 | Chen et al. ..................... 437/41 |
| 5,827,769 A | | 10/1998 | Aminzadeh et al. ........ 438/305 |
| 5,830,794 A | * | 11/1998 | Kusuniki et al. ............ 438/266 |
| 5,915,178 A | | 6/1999 | Chiang et al. ............... 438/266 |
| 5,949,706 A | * | 9/1999 | Chang et al. ................ 365/156 |
| 5,966,606 A | | 10/1999 | Ono ............................. 438/303 |
| 5,985,719 A | | 11/1999 | Keller et al. ................. 438/265 |
| 5,989,966 A | | 11/1999 | Huang ......................... 438/305 |
| 6,200,858 B1 | * | 3/2001 | Kokubu ....................... 438/261 |
| 6,221,708 B1 | * | 5/2001 | Gonzalez et al. ............ 438/216 |
| 6,232,179 B1 | * | 5/2001 | Sato ............................. 438/257 |

FOREIGN PATENT DOCUMENTS

WO   WO-98/50960   * 11/1998

* cited by examiner

*Primary Examiner*—Trung Dang
(74) *Attorney, Agent, or Firm*—George O. Saile; Stephen B. Ackerman; Sevgin Oktay

(57) ABSTRACT

A modified nitride spacer and making of the same are disclosed. The modified nitride spacer is formed adjacent a high-temperature oxide (HTO) layer which in turn is formed adjacent the sidewalls of a gate electrode. It is shown that the placement of an intervening oxide layer between the sidewalls of the gate electrode and the nitride spacer, in that order only, provides a significant improvement in charge retention in floating gate memory cells. Also, forming of the spacer from pure, undoped oxide only yields the same favorable results.

24 Claims, 5 Drawing Sheets

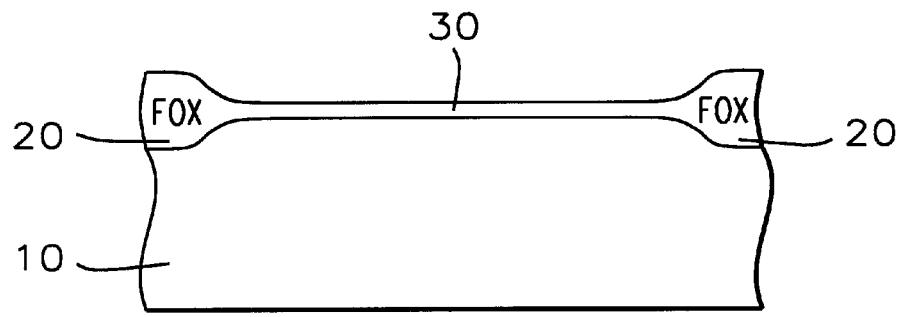
FIG. 1a – Prior Art
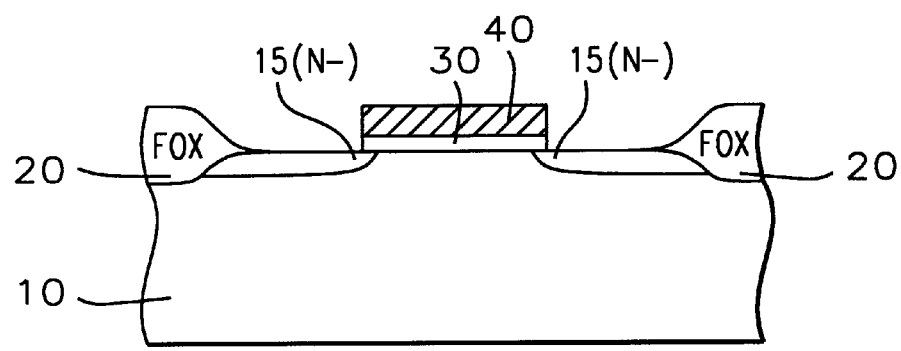
FIG. 1b – Prior Art
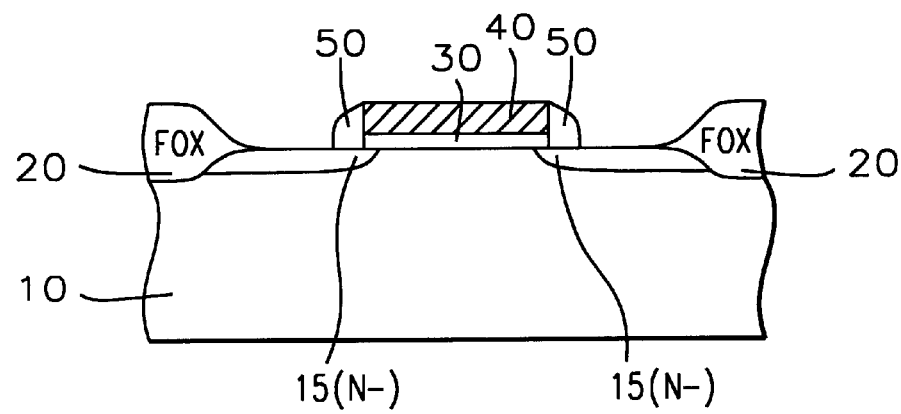
FIG. 1c – Prior Art

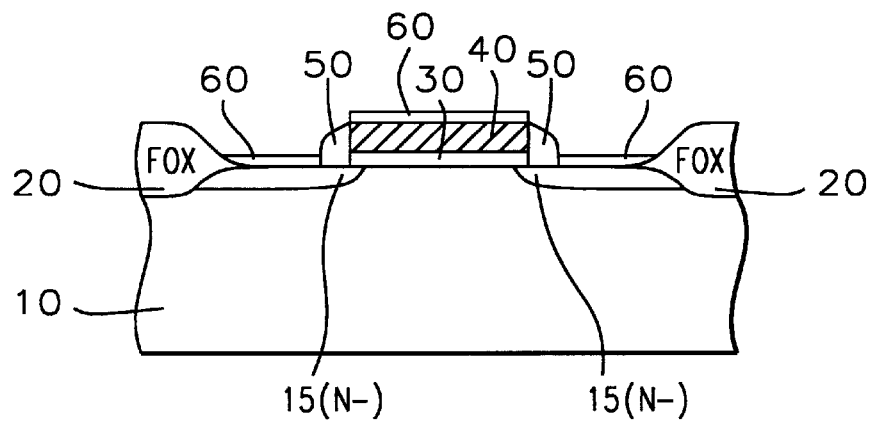
FIG. 1d – Prior Art
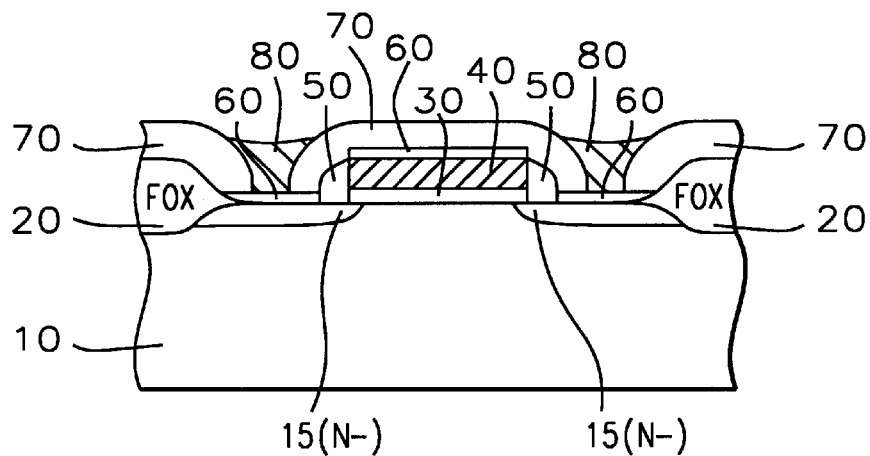
FIG. 1e – Prior Art
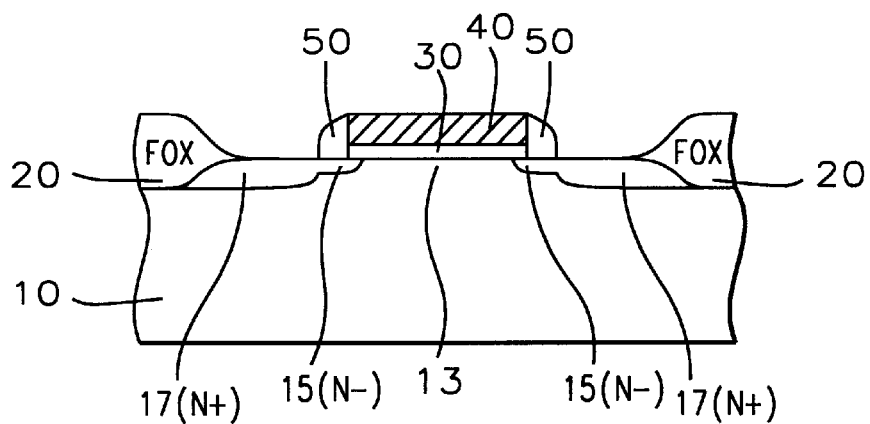
FIG. 1f – Prior Art

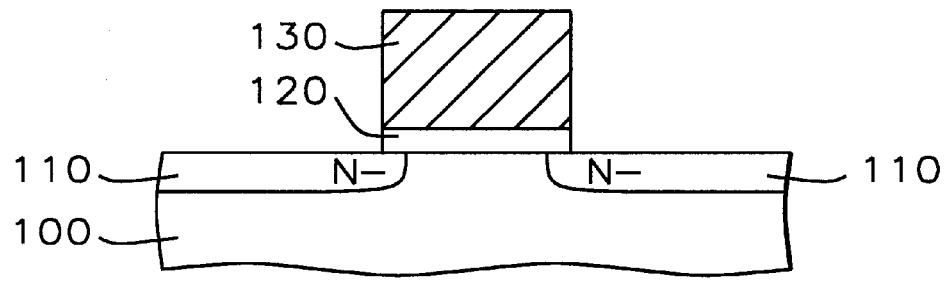
FIG. 2a
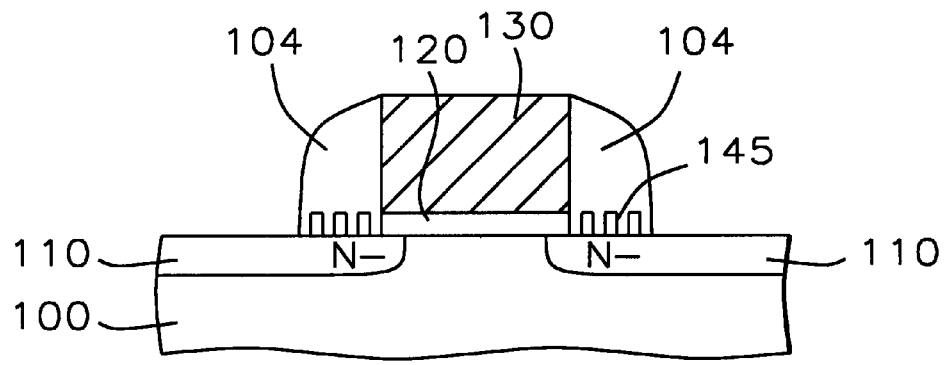
FIG. 2b – Prior Art
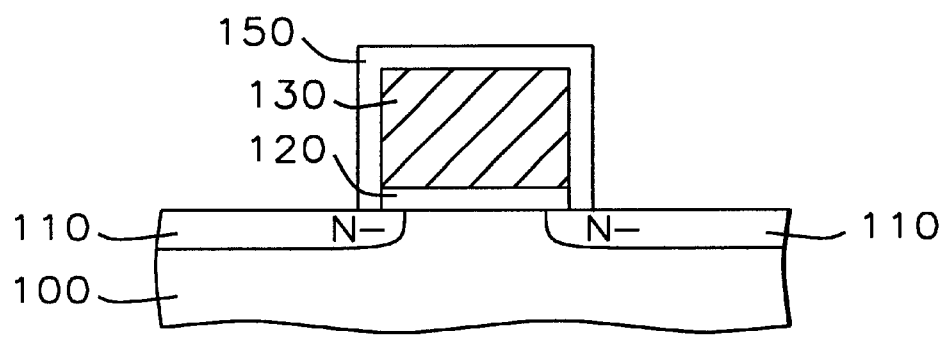
FIG. 2c

US 6,417,046 B1

MODIFIED NITRIDE SPACER FOR SOLVING CHARGE RETENTION ISSUE IN FLOATING GATE MEMORY CELL

BACKGROUND OF THE INVENTION (1) Field of the Invention

The present invention relates to the manufacture of semiconductor devices, and in particular, to a method of forming a modified nitride spacer for solving charge retention problem in a floating gate memory cell.

(2) Description of the Related Art

Spacers are used for several different purposes in the manufacture of semiconductor devices, among them for structural as well as electrical and programmability reasons. A well-known structural use, shown in FIGS. 1a–1f, is in the manufacture of field effect transistors (FETs), which are also very well-known for their very small size, high packing density in the Ultra Scale Integration (ULSI) technology. Employing conventional methods, gate-oxide layer (30) is first formed over substrate (10) having already defined active regions bounded by passive field oxide regions (20) shown in FIG. 1a. A polysilicon layer is blanket deposited over the substrate and etched to form poly-gate (40), as shown in FIG. 1b. Gate-oxide other than that underlying the poly-gate is also etched away. Using poly-gate as a self-aligned mask, ion implantation is usually employed to form source and drain regions (15). Subsequently, an oxide layer (not shown) is formed over the substrate and anisotropically etched, following conventional methods, to form oxide spacers (50) shown in FIG. 1c.

One of the early structural uses of oxide spacers such as shown (50) in FIG. 1d was in forming self-aligned silicide (SAC) contacts, which are well-known in the art. Thus, after the forming of the spacers, metal used to form the silicide is deposited over the substrate. The substrate is then heated, which causes the silicide reaction to occur wherever the metal is in contact with the silicon. Everywhere else, the metal remains unreacted. The unreacted metal is selectively removed through the use of an etchant that does not attack the silicide, the silicon, or the oxide. As a result, each exposed source and drain region is now completely covered by silicide film (60), out there is no film elsewhere. A dielectric layer, (70), is next deposited onto the silicide, and contact holes are opened in it down to the silicide layer following conventional techniques (FIG. 1e). Metal (80) is deposited into the contact holes to make contact with the silicide, which provides excellent electrical characteristics. Thus, the oxide spacers have performed the structural function of separating silicided areas from shorting each other, and also, as it will be known to those skilled in the art, providing tapered holes for making good tapered self-aligned silicide (SAC) contacts.

However, spacers (50) on the sidewall of gates, hence sometimes called sidewall spacers, also provide an important function in aligning ion implants which in turn control electron flow to and fro between the floating gate and the channel in the semiconductor substrate. In FIG. 1f, which is redrawn from FIG. 1d, the length of the space bounded by the source/drain regions (15) under poly-gate (400) is defined as the channel length (13) of the FET. As the advances in ultra scale integration continues, the channel length is further reduced resulting in undesirable short channel effects (SCE). This is due to the fact, as it will be known to those skilled in the art, that the band gap and built-in potential at junctions are an intrinsic property (constant) of the crystalline materials (such as silicon), and are non-scalable with the further reduction in device dimensions. One of the SCE effects exhibits itself, what is known as the hot carrier effect (HCE). This is where electrons ejected from the drain area can acquire sufficient energy to be injected into the gate oxide resulting in charge buildup in the oxide that causes threshold voltage shifts. Unfortunately, HCE is known to severely degrade the performance of FET devices.

One common method of minimizing these short channel effects is to fabricate FET structures with Lightly Doped Drains (LDDs), actually, including the source regions also. These LDD structures are formed using sidewall spacers, such as shown in FIG. 1f, and two implants. The LDDs serve to absorb some of the potential into the source/drain (S/D) regions and thus reduce the maximum electric field. One of these implants is self-aligned to the gate electrode, and forms lightly doped S/D regions (15) shown in FIG. 1f. The purpose of the first implant dose is to produce lightly doped section of the drain at the gate edge near channel (13). The heavier second implant is self-aligned to spacers (50), and forms a low resistivity region (17) of the S/D regions, which are also merged with the previously formed lightly doped regions (15), as seen in FIG. 1f. Since the heavily doped regions (17) are further away from the channel than would be the case in a conventional structure without the LDD, the depth of the heavily doped region can be made somewhat greater without adversely impacting the device operation. The increased junction depth lowers both the sheet resistance and the contact resistance of source/drain regions.

In prior art, sidewall spacers are also used to form the lightly doped S/Ds, or LDDs, by solid-phase diffusion from a doped oxide source that is also used as the sidewall spacers. Thus, doped side-wall spacers are formed by depositing a doped oxide (e.g., phosphosilicate glass (PSG)) and anisotropically etching as shown in FIG. 1f. After implanting the source/drain contact areas (17) ($N^+$), the substrate is annealed to drive in the dopant to form the lightly doped source/drain areas (15) ($N^-$) and to activate and anneal out the implant damage in the $N^+$ source/drain areas. However, the LDD regions (15) now extend further under the poly-gate, or gate electrode (40) such that the effective length of channel (13) is considerably reduced, sometimes by about one-half the original length of the channel. Thus, for an FET with a 0.2 $\mu$m gate width, the effective channel length could be only about 0.1 $\mu$m. In other words, gate electrode (40) significantly overlays the out diffused lightly doped S/D regions (15) resulting in high gate-to-drain capacitance that degrades the RC delay time, as it will be known to those skilled in the art. Also, the LDD S/D regions extending significantly under the gate electrode results in unwanted short channel effects, such as hot carrier injection in the gate oxide.

Huang of U.S. Pat. No. 5,989,966 proposes a method for suppressing such short channel effects by forming gate oxide on a substrate and patterning a polysilicon to form a gate electrode; forming first spacers comprising silicon nitride on the sidewalls of the gate electrode; forming second sidewall spacers from a doped oxide that serve as a solid-phase diffusion source; implanting S/D regions adjacent second sidewall spacers; annealing the substrate to diffuse dopant from the second sidewall spacers to form the lightly doped S/D regions; thus using the first silicon nitride spacers to serve as a diffusion barrier so that the LDDs formed under the gate electrode do not intrude as much into the channel area under the gate electrode. And hence, the reduced gate-to-drain overlay capacitance and improved immunity to hot electron effects.

Another method for achieving increased resistance to hot carrier damage with the use of sidewall spacers is disclosed by Aminzadeh, et al., in U.S. Pat. No. 5,827,769. Here, an oxide is grown on the gate electrode. This oxide s strengthened by nitridation and anneal. After a light doped drain implant, a second side oxide and a conformal nitride layer are deposited. Then, the conformal nitride is anisotropically etched to form spacers for masking a high dose drain implant. An NMOS transistor fabricated with this process has been found to be forty percent less susceptible to hot carrier damage than a conventional LDD process.

In another U.S. Pat. No. 5,966,606, a sidewall spacer formed through nitridation of the gate electrode is disclosed by Ono. A sidewall film of a gate electrode is first fabricated as a two-layer structure including an underlying thin silicon nitride film and a relatively thick silicon oxide film. The silicon nitride film covers and protects the edge of the gate oxide film against formation of a gate bird's beak at the edge of the gate oxide film. The sidewall film spacer contacts with the silicon substrate substantially at the thick silicon oxide film of the sidewall, which prevents formation of a carrier trap area adjacent the channel area.

Keller, et al., show in U.S. Pat. No. 5,985,719, multi sidewall spacers in a method of forming a programmable non-volatile memory cell. A non-oxide spacer is formed over the sidewall of a gate electrode, covered by a shielding spacer, which may comprise silicon nitride, oxynitride compounds or aluminum, and again followed by another dielectric layer on the shielding layer. In still another U.S. Pat. No. 5,573,965, Chen, et al., use sidewall spacer technology to fabricate semiconductor devices and integrate circuits. The spacers are formed as composite, multi-layered structures of silicon oxides or of silicon oxides and silicon nitride. On the other hand, Hasegawa of U.S. Pat. No. 5,460,992 shows fabricating a non-volatile memory device with a multi-layered gate electrode structure by forming a floating gate electrode and a thermally oxidized silicon film on surfaces inclusive of a surface of the multi-layered gate electrode structure having a control gate, and then forming, by a thermal nitrifying treatment, a thermally nitrified oxidized silicon film at an interface between the thermally oxidized silicon film and the multi-layered gate electrode structure.

In a different U.S. Pat. No. 5,915,178, Chiang, et al., teach a method for improving the endurance of split gate flash EEPROM devices via the addition of a shallow source side implanted region.

Prior art shows the use of sidewall spacers for various purposes. It is shown in the present invention that by a judicious choice of materials in a particular sequence of sidewall spacers of certain widths, charge retention in non-volatile, floating gate memories can be improved substantially.

SUMMARY OF THE INVENTION

It is therefore an object of this invention to provide a method of forming a modified nitride spacer to improve charge retention in floating gate memory cells.

It is another object of this invention to provide method of forming a modified nitride spacer with a layer of oxide formed between the sidewalls of a floating gate electrode and the nitride spacer, and in that order only, in order to increase resistance to charge movement between the floating gate and the modified nitride spacer.

It is still another object of this invention to provide method of forming a pure oxide spacer to improve charge retention in floating gate memory cells.

It is yet another object of the present invention to provide a modified nitride spacer and a pure oxide spacer to improve charge retention in floating gate memory cells.

These objects are accomplished by providing a semiconductor substrate doped with a first conductive type dopant and having a plurality of active and field regions defined; forming a gate oxide layer over said substrate; forming a polysilicon layer doped with a second conductive type of dopant over said gate oxide layer; patterning said polysilicon layer to form a gate electrode having sidewalls over said gate oxide layer; performing first ion implant on said substrate using said gate electrode as a mask to form lightly doped source/drain regions; forming an oxide layer over said gate electrode; forming a nitride layer over said oxide layer; etching anisotropically said silicon nitride layer to form nitride spacers on sidewalls of said gate electrode; and performing second ion implant on said substrate using said nitride spacers as a mask to complete the forming of sad source/drain regions.

These objects are also accomplished in a second embodiment where only pure oxide is used in making spacers on the sidewalls of the floating gate in order to improve the charge retention characteristics of the floating gate memory cell.

The objects of the instant invention are further accomplished by providing a modified nitride spacer and a pure oxide spacer to improve charge retention in floating gate memory cells.

BRIEF DESCRIPTION OF THE DRAWINGS

FIG. 1a is a cross-sectional view of a portion of a semiconductor substrate showing the forming of gate oxide layer over an active area defined by field oxide regions, according to prior art.

FIG. 1b is a cross-sectional view of a portion of a semiconductor substrate showing the patterning of a polysilicon gate electrode and the forming of the lightly doped source/drain (S/D) regions of the substrate, according to prior art.

FIG. 1c is a cross-sectional view of a portion of a semiconductor substrate showing the forming of sidewall spacers, according to prior art.

FIG. 1d is a cross-sectional view of a portion of a semiconductor substrate showing the forming of silicided metal, according to prior art.

FIG. 1e is a cross-sectional view of a portion of a semiconductor substrate showing the forming of self-aligned silicide contacts (SAC), according to prior art.

FIG. 1f is a cross-sectional view of a portion of a semiconductor substrate showing the forming of the heavily doped source/drain (S/D) regions of the substrate, according to prior art.

FIG. 2a is a cross-sectional view of a portion of a semiconductor substrate showing the patterning of a polysilicon gate electrode and the forming of the lightly doped source/drain (S/D) regions of the substrate, according to the present invention.

FIG. 2b is a cross-sectional view of a portion of a semiconductor substrate showing the forming of conventional nitride spacers and the resulting charge traps, according to prior art.

FIG. 2c is a cross-sectional view of a portion of a semiconductor substrate showing the forming of an undoped high-temperature oxide (HTO) layer adjacent to the sidewalls of the floating gate electrode of FIG. 2a, according to the present invention.

DESCRIPTION OF THE PREFERRED EMBODIMENTS

Figure 2D:
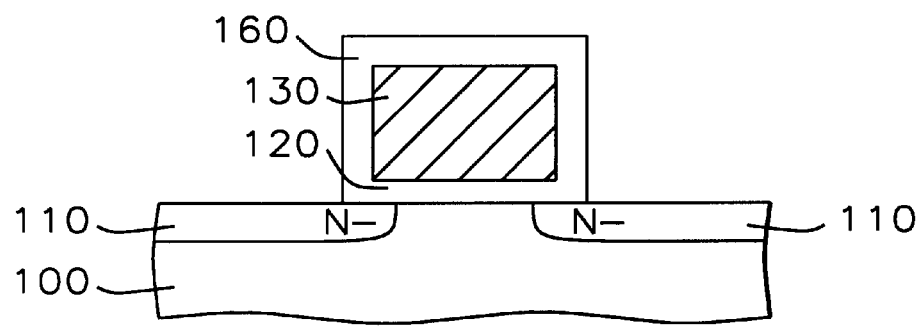
FIG. 2d is a cross-sectional view of a portion of a semiconductor substrate showing the forming of plasma enhanced PE-oxide layer adjacent to the sidewalls of the floating gate electrode of FIG. 2a, according to the present invention.

Referring now to the drawings, in particular to FIGS. 2a and 2c–2f, there is shown steps of forming modified nitride spacers in order to improve charge retention in floating gate memory cells.

In FIG. 2a, a portion of a device area on substrate (100) is shown. The substrate is preferably a single-crystal silicon doped with a first conductive type dopant, such as boron (B). Gate oxide layer (120) is formed on substrate (100) to a thickness between about 70 to 120 Å, followed by the forming of a polysilicon layer (not shown). The polysilicon layer is next patterned to form gate electrode (130) over the device area. Gate oxide layer also follows the pattern and is removed until substrate surface is reached. Subsequently, using the electrode as a self-aligned mask, a first ion implant is performed to form source/drain regions (110) as shown in the same FIG. 2a. The first ion implant is preferably lightly doped at a dosage level between about $1\times10^{14}$ to $1\times10^{15}$ atoms/cm² and energy level between about 10 to 50 KeV.

The preferred method of forming the gate oxide is by thermal oxidation in dry oxygen carried out in an oxidation furnace in a temperature range between about 750 to 1000° C. Alternatively, other oxidation methods can be used, such as oxidation in a dry oxygen and anhydrous hydrogen chloride in an atmospheric or low pressure environment, or low temperature, high-pressure, and the like. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 400 to 800° C. The preferred thickness is between about 1500 to 2500 Å. The polysilicon layer can be doped in situ or by ion implantation with arsenic (As) or phosphorus (P) to a preferred dose between about $1\times10^{15}$ to $1\times10^{16}$ atoms/cm².

Typically, at the next step, a nitride spacer is formed following conventional techniques, as shown in a prior art FIG. 2b. However, the nitride layer adjacent the sidewalls of electrode (130) forms a trap area (145) at the boundary between the silicon nitride layer and the silicon substrate, as shown in the same FIG. 2b. As described by Ono in U.S. Pat. No. 5,966,606, trap area (145) causes an increase in the parasitic resistance to the extent of degrading the electrical characteristics of the FET device. In addition, silicon nitride has a larger Young's modulus compared with that of the gate oxide, thereby increasing the stress at the edge of the gate structure and at the interface between the silicon nitride layer and the silicon substrate, which can cause structural failure. Further, silicon nitride has a relative permittivity of 7.4 which is considerably higher than a relative permittivity of 3.9 for silicon oxide, thereby increasing the parasitic capacitance between the gate electrode and source/drain, and, hence, the operational speed of the device.

Thus, in order to alleviate some of these problems associated with nitride spacers, and as a main feature of the present invention, an oxide layer is formed between the nitride spacer and the sidewalls of the gate electrode. It will be appreciated by those skilled in the art that an oxide layer formed prior to the forming of the nitride spacer will provide the needed stress relief due to the aforementioned differences in the Young's modulus while at the same time providing a permittivity which is commensurate with that of the adjacent gate oxide layer, hence reducing the parasitic capacitance between the gate electrode and source/drain in the substrate. Also, the presence of an oxide layer on the sidewall of the gate electrode ahead of the nitride spacer will provide higher resistance to charge movement between the floating gate electrode and the modified nitride spacer.

Accordingly, a layer of oxide, reference numeral (150) in FIG. 2c, is formed conformally over polysilicon floating gate (130). It is important that the oxide is pure, that is, undoped, and preferably a high-temperature oxide (HTO). Specifically, the oxide is formed by a low pressure chemical vapor deposition (LPCVD) process in which dichlorosilane and nitrous oxide are reacted to yield:

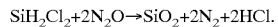

$$SiH_2Cl_2+2N_2O \rightarrow SiO_2+2N_2+2HCl.$$

It will be known to those skilled in the art that HTO films have excellent uniformity, with properties close to those of thermal $SiO_2$, and is especially suited for depositing $SiO_2$ over polysilicon. It is preferred that HTO layer (150) has a thickness between about 170 to 200 Å. However, plasma enhanced chemical vapor deposited oxide, or, PECVD oxide can also be used with a thickness between about 700 to 800 Å. Thicker oxide layer (160) is shown in FIG. 2d.

Figure 2E:
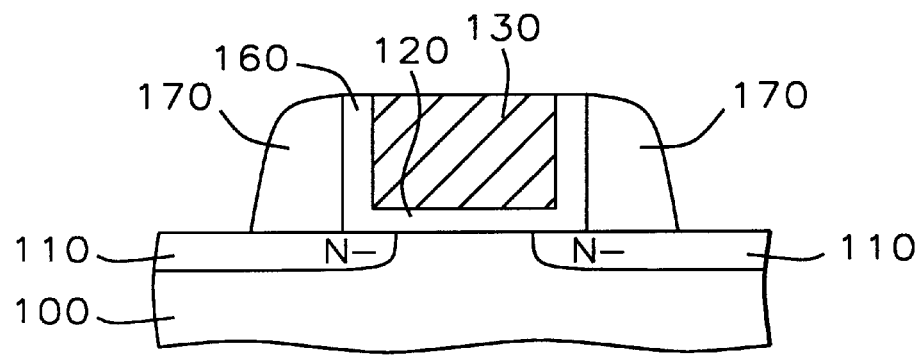
FIG. 2e is a cross-sectional view of a portion of a semiconductor substrate showing the forming of the modified nitride spacer of this invention adjacent the oxide layer of FIG. 2d or 2c, according to the present invention.

Next, a silicon nitride $(Si_3N_4)$ layer (not shown) is conformally formed over the gate electrode to a thickness between about 800 to 2000 Å, and then anisotropically etched back to form the modified nitride spacers (170) of this invention, as shown in FIG. 2e. The nitride layer can be deposited by LPCVD using, for example, dichlorosilane $(SiCl_2H_2)$ and ammonia $(NH_3)$, and etched back at low pressure in a reactive ion etcher (RIE) or in a high-density plasma (HDP) etcher using a gas mixture such as carbon tetrachloride $(CF_4)$ and hydrogen $(H_2)$.

Figure 2F:
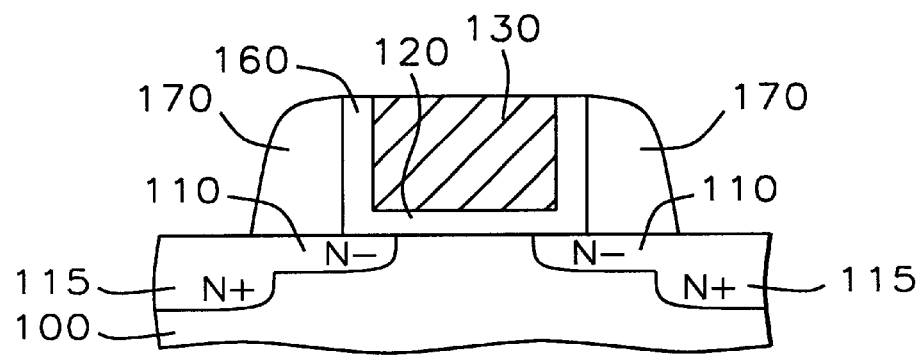
FIG. 2f is a cross-sectional view of a portion of a semiconductor substrate showing the forming of the heavily doped source/drain (S/D) regions of the substrate of FIG. 2a, according to the present invention.
Figure 3:
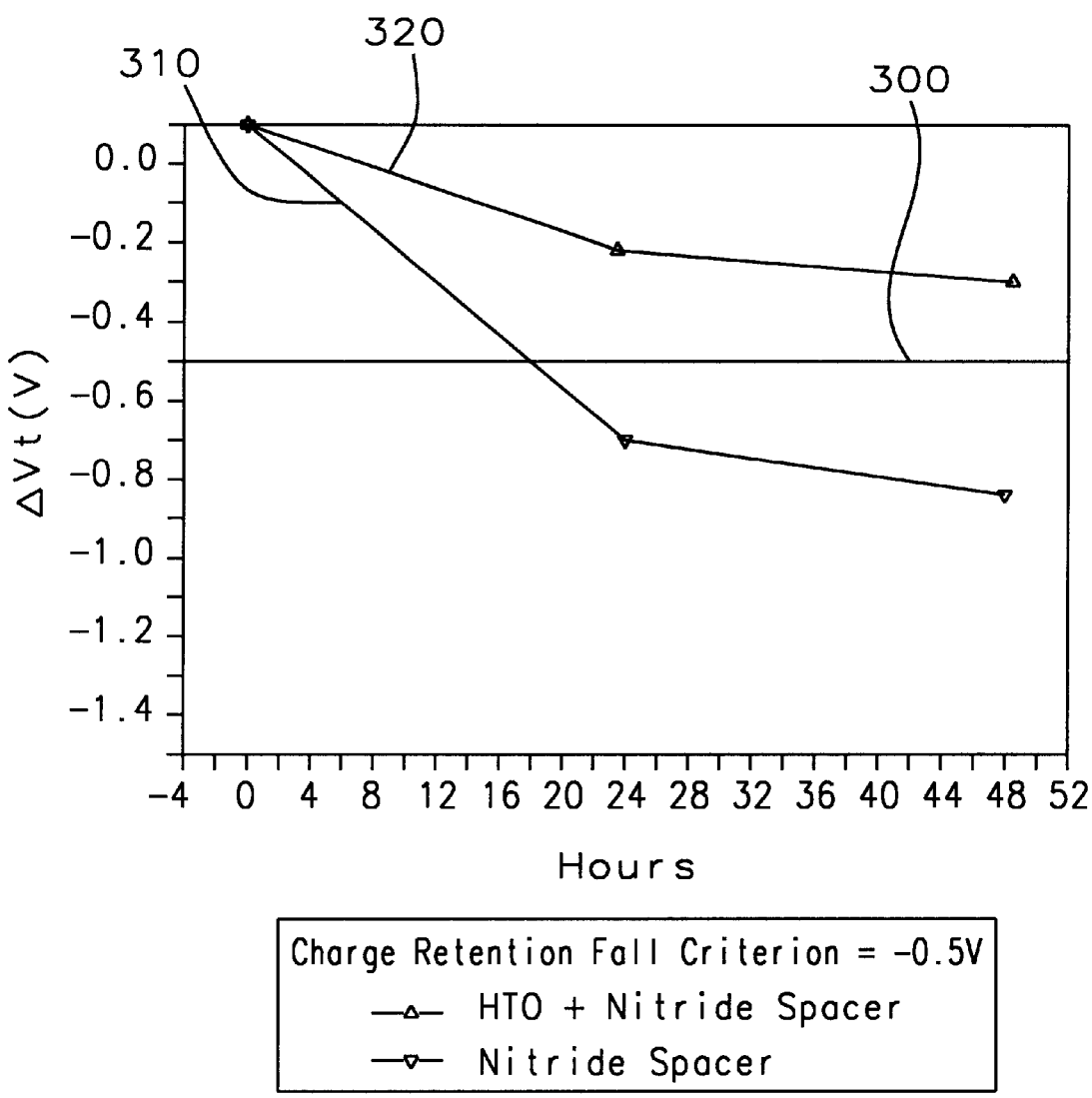
FIG. 3 shows a comparison of the change in charge retention in floating gate memory cells with conventional nitride spacers versus cells with disclosed modified nitride spacers in terms of change in threshold voltage $V_t$ as a function of fail time in hours.

Referring now to FIG. 2f, the heavily doped source/drain regions (115) are formed next by performing a second implant using As ions at a dosage level between about $1\times10^{15}$ to $1\times10^{16}$ atoms/cm² and energy level between about 50 to 100 KeV. It will be observed that modified nitride spacers (170) of the invention are used as an implant mask to self-align source/drain regions (115) to the spacers. With the disclosed modified nitride spacers having the intervening HTO layer, the measured charge retention in the FET device is substantially improved. This is shown in FIG. 3 where change in threshold voltage, $\Delta V_t$, is plotted as a function of time in hours. Charge retention fail criterion is −0.5 volts, as shown by curve (300) in the same FIG. 3. Comparing curve (320) for a modified nitride spacer with HTO to curve (310) of a conventional nitride spacer, it is seen clearly that whereas the latter fails at about 16 hours, the former survives for a much longer time.

Though numerous details of the disclosed method are set forth here to provide an understanding of the present invention, it will be obvious, however, to those skilled in the art that these specific details need not be employed to practice the present invention. At the same time, it will be evident that the same methods may be employed in other similar process steps that are too many to cite, such as, for example, in making FETs of a different polarity. That is, by reversing the polarity of dopants, an N-channel FET can be made a P-channel FET, and vice versa. Further, by including additional photoresist masking steps, the N-channel and P-channel FETs can be formed concurrently on the same substrate for CMOS circuit applicatIons.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a modified nitride spacer in a floating gate memory cell comprising the steps of:

providing a semiconductor substrate doped with a first conductive type dopant and having a plurality of active and field regions defined;

forming a gate oxide layer over said substrate;

forming a polysilicon layer doped with a second conductive type of dopant over said gate oxide layer;

patterning said polysilicon layer to form a gate electrode having sidewalls over said gate oxide layer; then performing first ion implant on said substrate using said gate electrode as a mask to form lightly doped source/drain regions; then forming an oxide layer over said gate electrode; then forming a nitride layer over said oxide layer; then etching said silicon nitride layer to form nitride spacers on sidewalls of said gate electrode; and performing second ion implant on said substrate using said nitride spacers as a mask to complete the forming of said source/drain regions.

2. The method of claim 1, wherein said forming said gate oxide layer is accomplished by thermal growth at a temperature between about 750 to 1000° C.

3. The method of claim 1, wherein said gate oxide layer has a thickness between about 70 to 120 Å.

4. The method of claim 1, wherein said forming said polysilicon layer is accomplished with silicon source $SiH_4$ using LPCVD at a temperature between about 400 to 800° C.

5. The method of claim 1, wherein said gate electrode has a thickness between about 1500 to 2500 Å.

6. The method of claim 1, wherein said performing said first ion implant is accomplished with As ions at a dosage level between about $1\times10^{15}$ to $1\times10^6$ atoms/cm$^2$ and energy level between about 50 to 100 KeV.

7. The method of claim 1, wherein said oxide layer has a thickness between about 170 to 800 Å.

8. The method of claim 1, wherein said oxide layer comprises high-temperature oxide (HTO) performed at a temperature between about 400 to 800° C.

9. The method of claim 1, wherein said oxide layer comprises Plasma Enhanced PE-oxide.

10. The method of claim 1, wherein said forming said nitride layer is accomplished by reacting dichlorosilane ($SiCl_2H_2$) with ammonia ($NH_3$) in an LPCVD at temperature range between about 500 to 900° C.

11. The method of claim 1, wherein the thickness of said nitride layer is between about 800 to 2000 Å.

12. The method of claim 1, wherein said etching is accomplished anisotropically.

13. The method of claim 1, wherein said performing said second ion implant is accomplished with As ions at a dosage level between about $1\times10^{15}$ to $1\times10^{16}$ atoms/cm$^2$ and energy level between about 50 to 100 KeV.

14. A method of forming a modified spacer in a floating gate memory cell comprising the steps of:

providing a semiconductor substrate doped with a first conductive type dopant and having a plurality of active and field regions defined;

forming a gate oxide layer over said substrate;

forming a polysilicon layer doped with a second conductive type of dopant over said gate oxide layer;

patterning said polysilicon layer to form a gate electrode having sidewalls over said gate oxide layer;

performing first ion implant on said substrate using said gate electrode as a mask to form lightly doped source/drain regions;

forming an oxide layer over said gate electrode;

etching said oxide layer to form oxide spacers on sidewalls of said gate electrode; and performing second ion implant on said substrate using said oxide spacers as a mask to complete the forming of said source/drain regions.

15. The method of claim 14, wherein said forming said gate oxide layer is accomplished by thermal growth at a temperature between about 750 to 1000° C.

16. The method of claim 14, wherein said gate oxide layer has a thickness between about 70 to 120 Å.

17. The method of claim 14, wherein said forming said polysilicon layer is accomplished with silicon source $SiH_4$ using LPCVD at a temperature between about 400 to 800° C.

18. The method of claim 14, wherein said gate electrode has a thickness between about 1500 to 2500 Å.

19. The method of claim 14, wherein said performing said first ion implant is accomplished with As ions at a dosage level between about $1\times10^{15}$ to $1\times10^{16}$ atoms /cm$^2$ and energy level between about 50 to 100 KeV.

20. The method of claim 14, wherein said oxide layer has a thickness between about 170 to 800 Å.

21. The method of claim 14, wherein said oxide layer comprises high-temperature oxide (HTO) performed at a temperature between about 400 to 800° C.

22. The method of claim 14, wherein said oxide layer comprises Plasma Enhanced PE-oxide.

23. The method of claim 14, wherein said etching is accomplished anisotropically.

24. The method of claim 14, wherein said performing said second ion implant is accomplished with As ions at a dosage level between about $1\times10^{15}$ to $1\times10^{16}$ atoms /cm$^2$ and energy level between about 50 to 100 KeV.

* * * * *